United States Patent [19]
Nikaido et al.

[11] Patent Number: 5,473,175
[45] Date of Patent: Dec. 5, 1995

[54] MULTI-2DEG HEMT

[75] Inventors: Jun-Ichiro Nikaido; Yutaka Minimo, both of Yamanashi, Japan

[73] Assignees: Fijitsu Limited, Kawasaki; Fijitsu Quantum Devices Limited, Yamanashi, Japan

[21] Appl. No.: 115,322

[22] Filed: Sep. 2, 1993

[30]    Foreign Application Priority Data

Sep. 2, 1992   [JP]   Japan ................... 4-234425

[51] Int. Cl.⁶ ............... H01L 29/812; H01L 29/778
[52] U.S. Cl. ............................ 257/192; 257/194
[58] Field of Search ................ 257/24, 29, 192, 257/194, 27

[56]             References Cited

U.S. PATENT DOCUMENTS

| | | | |
|---|---|---|---|
| 5,151,757 | 9/1992 | Enoki et al. | 257/194 |
| 5,223,724 | 6/1993 | Green, Jr. | 257/194 |
| 5,258,632 | 11/1993 | Sawada | 257/194 |
| 5,262,660 | 11/1993 | Streit et al. | 257/194 |

OTHER PUBLICATIONS

Ishikawa et al., "Improvement of two-dimensional electron gas concentration in selectively ..."; Journal of Appl. Phys. 61(5) 1 Mar. 1987,; pp. 1937–1940.

*Primary Examiner*—Robert P. Limanek
*Assistant Examiner*—Wael M. Fahmy
*Attorney, Agent, or Firm*—Staas & Halsey

[57]              ABSTRACT

A high electron mobility field effect semiconductor device includes a layer stack including electron supply layers and electron transport layers to form a plurality of hetero-junctions so as to provide 2DEG layers in hetero-interfaces on the electron transport layer side, a source electrode and a drain electrode disposed with an interval on a surface of the layer stack to oppose each other and to be conductive to the 2DEG layers, and a gate electrode extending between the source and drain electrodes to develop a Schottky contact with the upper-most carrier supply layer. The electron supply layer remote from the gate electrode has an electron density higher than that of the electron supply layer less remote from the gate electrode.

5 Claims, 12 Drawing Sheets

MULTI-2DEG HEMT

BACKGROUND OF THE INVENTION

1. Field of the Invention

The present invention relates to improvement of a high electron mobility field effect semiconductor device of a multi-hetero-structure type including a plurality of two-dimensional electron gas (2DEG) layers each formed of a carrier supply layer and a carrier transport layer.

Although a single layer can establish two 2DEG layers or can supply carriers to two carrier transport (channel) layers, they can be counted as two adjoined layers, unless otherwise specified, in this specification.

Recently, high electron mobility transistors (HEMT's) have been increasingly utilized for high-frequency communications employing, for example, microwaves and higher-frequency waves. There still remains a need for further improvement of HEMT's to increase performance and efficiency thereof.

2. Description of the Related Art

In an ordinary configuration of a high-power HEMT, to develop a high-power output signal, there has been usually adopted a multi-hetero-structure including a plurality of layer stacks or multi-layered blocks each having a carrier supply layer and channel layer.

FIG. 11 is a cross-sectional side view of a primary portion of a conventional example of an HEMT having a double hetero-structure.

The configuration of FIG. 11 includes a semi-insulating GaAs substrate 1, a non-doped GaAs buffer layer 2, an n-type AlGaAs carrier supply layer 3, a non-doped GaAs carrier transport layer 4, an n-type AlGaAs carrier supply layer 5, an n-type GaAs cap layer 6, a source electrode 7, a drain electrode 8, a gate electrode 9, and 2DEG layers 10 and 11.

Since n-type AlGaAs carrier supply layers have an energy gap wider than that of a non-doped GaAs carrier transport layer, a narrow potential well is formed in the neighborhood of each interface of the carrier transport layer. Carriers existing in the supply layer fall into a potential well to generate a two-dimensional electron gas layer.

As compared with a single hetero-structure HEMT, the double hetero-structure HEMT develops a higher value of a common gate drain-source current $I_{dss}$ per unitary gate width, namely, a higher output current.

In this connection, regardless of a conduction type, namely, whether carriers are electrons or holes, the abbreviated terms HEMT and 2DEG are used herebelow in this specification. Namely, when the carriers are holes, the abbreviation E (electron) designates holes.

In an HEMT having a double hetero-structure, according to the gate control theory, the two-dimensional carrier gas layer 10 of the lower-hetero-interface is controlled after the upper hetero-interface or hetero-boundary is completely depleted. The distance between the gate electrode 9 and the lower hetero-interface is naturally larger than that between the gate electrode 9 and the upper hetero-interface. Thickness of the depletion layer is consequently increased and hence the gate capacitance becomes small.

In general, the transconductance or mutual conductance $g_m$ is an essential factor for transistors. This is also the case with the HEMT's. The transconductance $g_m$ is proportional to the gate capacitance $C_{gs}$.

In the double hetero-structure HEMT, since the distance between the upper hetero-interface and the gate electrode 9 is different from that between the lower hetero-interface and the gate electrode 9, the transconductance $g_m$ of the upper hetero-interface is larger than that of the lower hetero-interface.

FIG. 12 is a graph showing relationships between a gate bias voltage $V_{gs}$ and the transconductance $g_m$ of the HEMT of FIG. 11. The abcissa and the ordinate respectively stand for the gate bias voltage $V_{gs}$ and the transconductance $g_m$.

As can be seen from this graph, in the characteristic curve representing the relationships between the gate bias voltage $V_{gs}$ and the transconductance $g_m$ of the HEMT, there take place two peaks having different heights. The high and low peaks are associated with the upper and lower hetero-interfaces or hetero-boundary regions, respectively.

For a high-power HEMT to develop a favorable linearity, it is desirable to have a flat characteristic line of the relationships between the gate-bias voltage $V_{gs}$ and the transconductance $g_m$. In the HEMT of FIG. 11, however, there appear two peaks having different heights in the transconductance $g_m$, leading to a poor linearity.

SUMMARY OF THE INVENTION

It is therefore an object of the present invention to provide a high carrier mobility field effect semiconductor device having plural hetero-junctions, wherein it is possible to set, only by use of quite simple means, the transconductance $g_m$ to substantially an identical value in each hetero-interface of a plurality of 2DEG structures regardless of distances thereof from the associated gate electrode region.

Another object of the present invention is to provide a high carrier mobility field effect semiconductor device having a plurality of two-dimensional hetero-junctions in which the transconductance $g_m$ develops substantially a generally flat contour and an improved linearity.

According to one aspect of the present invention, there is provided a high electron mobility field effect semiconductor device including multi-hetero-junction layer stacks each including a carrier supply layer and a carrier transport layer to thereby form a plurality of hetero-junctions so as to generate 2DEG layers in hetero-boundary-regions on side portions respectively of the carrier transport layers, source and drain electrodes disposed on a surface of the layer stack to oppose each other and to be electrically conductive to the gas layers, and a gate electrode extending between the source and drain electrodes to form a Schottky contact to an upper-most carrier supply layer, wherein the 2DEG layer on a remote side of the gate electrode region has a 2DEG concentration higher than that of the 2DEG layer on a near side of the gate electrode.

To implement the device, there may also be used, in place of the increase of the 2DEG concentration, decrease of the effective mass of carriers, increase of the magnitude of band discontinuity, control of the carrier concentration according to planar doping. Alternatively, these processes may be arbitrarily combined with each other for the purpose as described above.

With provision of the above constitution, the lower hetero-structure has an improved 2DEG characteristic as compared with the upper hetero-structure. Even when the distance between the gate electrode and the lower hetero-interface is longer than that between the gate electrode and the upper hetero-interface, the transconductance $g_m$ of the lower hetero-structure is retained to be substantially identical to that of the upper hetero-structure. Resultantly, the characteristic of transconductance $g_m$ vs gate bias voltage $V_{gs}$ becomes generally flat with a satisfactory balance.

Specifically, in the conventional device structure, as for the third order mutual modulation distortion, −30 dBc is developed for 4 GHz at a $P_1$ dB point (1 dB gain compression power). In the class B operation with a decreased current, there is attained 200 mW/mm. According to the embodiment of the present invention, −40 dBc and 400 mW/mm are developed, showing the advantageous feature of the present invention.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

The configuration of epitaxially grown semiconductor crystalline layers constituting an HEMT is modified so that transconductance $g_m$ resultant from 2DEG layers in multi-hetero structures thus developed is arranged to have substantially a similar peak value. Consequently, the general shape of the characteristic curve related to the transconductance $g_m$ is flattened in a wider region and the transconductance $g_m$ is kept at a high value.

More concretely, there is employed the following means, for example. The carrier concentration of the carrier supply layer remote from the gate electrode region is set to be higher than that of the carrier supply layer less remote therefrom. Alternately, there is adopted a constitution including two carrier transport layers such that the lower one thereof has a carrier density higher than that of the upper one thereof. Alternatively, the effective mass of a carrier in the lower carrier transport layer is controlled to take a low value so as to increase the carrier speed.

Figure 1:
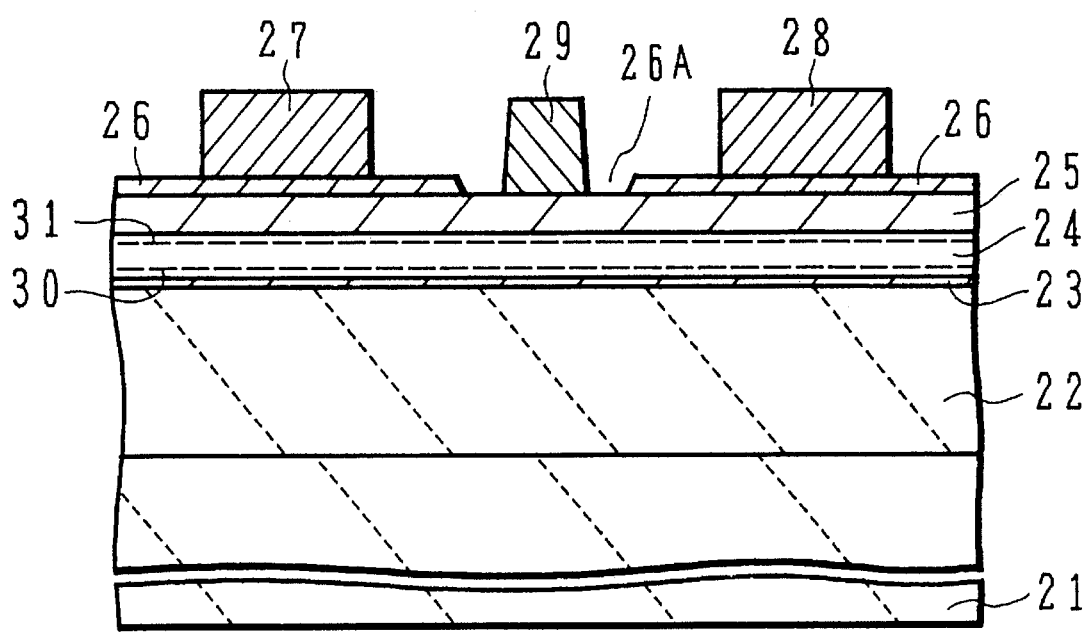
FIG. 1 is a side view of a cross section of a main portion of a GaAs-based HEMT according to a first embodiment of the present invention.

FIG. 1 shows a main portion of a GaAs-based HEMT according to a first embodiment of the present invention.

The high electron mobility field effect semiconductor device includes multi-hetero-junction stacks including carrier supply layers (e.g., an n-type AlGaAs lower layer 23 and an n-type AlGaAs upper layer 25) and carrier transport layers (e.g., a non-doped GaAs electron transport layer 24) to form a plurality of hetero-junctions so as to generate 2DEG layers (e.g., a lower 2DEG layer 30 and an upper 2DEG layer 31) in hetero-intersections on side portions respectively of the carrier transport layers, a source electrode (e.g., a region 27) and a drain electrode (e.g., a region 28) being disposed on a surface of the multi-layer stack to oppose each other and to be electrically conductive to the 2DEG layers, and a gate electrode (e.g., a region 29) extending between the source and drain electrodes to form a Schottky contact with an upper-most carrier supply layer, wherein the carrier supply layer having a short distance to the gate electrode has a carrier concentration (e.g., $2.0\times10^{18}$ $cm^{-3}$) higher than that (e.g., $4.5\times10^{18}$ $cm^{-3}$) of the carrier supply layer having a long distance to the gate electrode.

Next, process of manufacturing the device will now be described by reference to FIG. 1.

1-(1)

On a semi-insulating GaAs substrate 21, there are sequentially and epitaxially formed a non-doped GaAs buffer layer 22, an n-type AlGaAs lower electron supply layer 23, a non-doped GaAs electron transport layer 24, an n-type AlGaAs upper electron supply layer 25, and an N-type GaAs cap layer 26 by a molecular beam epitaxy (MBE).

These layers are formed in accordance with the following parameters, for example.

| | |
|---|---|
| ① | Non-doped GaAs buffer layer 22 |
| | Thickness: 1 μm |
| ② | n-type AlGaAs lower electron supply layer 23 |
| | Electron density: $4.5 \times 10^{18}$ $cm^{-3}$ |
| | Dopant: Si |
| | Thickness: 50 Å |
| ③ | Non-doped electron transport layer 24 |
| | Thickness: 500 Å |
| ④ | n-type AlGaAs upper electron supply layer 25 |
| | Electron density: $2.0 \times 10^{18}$ $cm^{-3}$ |
| | Dopant: Si |
| | Thickness: 400 Å |
| ⑤ | n-type GaAs cap layer 26 |
| | Electron density: $2.0 \times 10^{18}$ $cm^{-3}$ |
| | Dopant: Si |
| | Thickness: 200 Å |

In this regard, the electron density and the thickness of the layer 23 are respectively about 2.5 times and about 8 times those of the layer 25. To manufacture the layers above, there may be appropriately employed metalorganic chemical vapor deposition (MOCVD) in place of MBE.

Applying resist process of lithography and vacuum vapor deposition, there is formed a resist layer having openings for areas in which source and drain electrodes are to be manufactured, and then an AuGe/Au layer stack is grown, the AuGe and Au layers having thicknesses of, for example, 400 A and 4000 A, respectively. 1-(3)

Dipping in a resist remover, the resist layer prepared in the process step 1-(2) is peeled off; thereafter, the AuGe/Au film stack is patterned by lift-off process, thereby fabricating the source and drain electrodes 27 and 28.
1-(4)

Through a resist process and reactive ion etching (RIE) using CHCl$_2$F gas as the etching gas, the n-type GaAs cap layer 26 is etched so as to form a gate recess 26A.
1-(5)

With the resist layer created in the step 1-(4) kept remained, vacuum deposition is achieved to form a Ti/Au stack, the Ti and Au layers having thicknesses of, for example, 200 A and 3000 A, respectively.

Dipping in a resist remover, the resist layer formed in the process step 1-(4) is removed, and then the Ti/Au layer stack created in the process 1-(5) is patterned through liftoff process, thereby manufacturing the gate electrode 29 forming a Schottky contact with the n-type AlGaAs upper electron supply layer 25 exposed in the gate recess 26A. In this regard, reference numerals 30 and 31 indicate lower and upper 2DEG layers, respectively.

Figure 2:
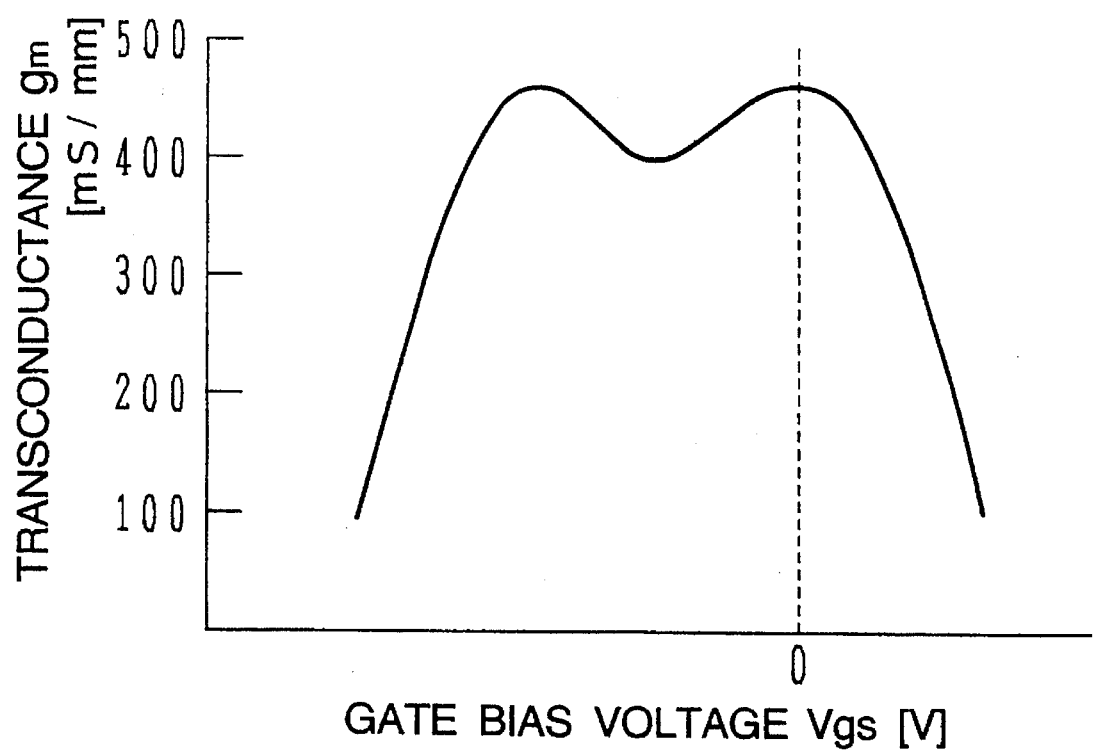
FIG. 2 is a graph showing a relationship between the transconductance $g_m$ and the gate bias voltage $V_{gs}$ of the first embodiment of FIG. 1.

FIG. 2 is a graph showing a relationship between the transconductance $g_m$ and the gate bias voltage $V_{gs}$ of an HEMT in an embodiment of FIG. 1A. The abscissa and the ordinate denote the gate bias voltage $V_{gs}$ and the transconductance $g_m$, respectively. The transconductance $g_m$ is represented with values per unitary gate width (mm).

As can be appreciated from the graph, in the curve representing the characteristic of relationships between the transconductance $g_m$ and the gate bias voltage $V_{gs}$, there appear two peaks respectively associated with the 2DEG layer 30 in the lower hetero-boundary region and the 2DEG layer 31 in the upper hetero-interface. However, the peaks take substantially similar value and hence the contour of the curve is generally flat.

In the first embodiment, the ratio between the electron density of the layer 23 of the lower hetero-structure and that of the layer 25 of the upper hetero-structure is substantially equal to the ratio between the distance from the lower hetero-interface to the gate electrode 29 and that from the upper hetero-boundary region thereto.

In short, the electron densities are decided to satisfy a relationship "electron density of layer 25/electron density of layer 23=distance between gate electrode 29 and upper hetero boundary/distance between gate electrode 29 and lower hetero boundary". In this connection, the composition of aluminum in AlGaAs is about 0.25 in all cases.

Figure 3A:
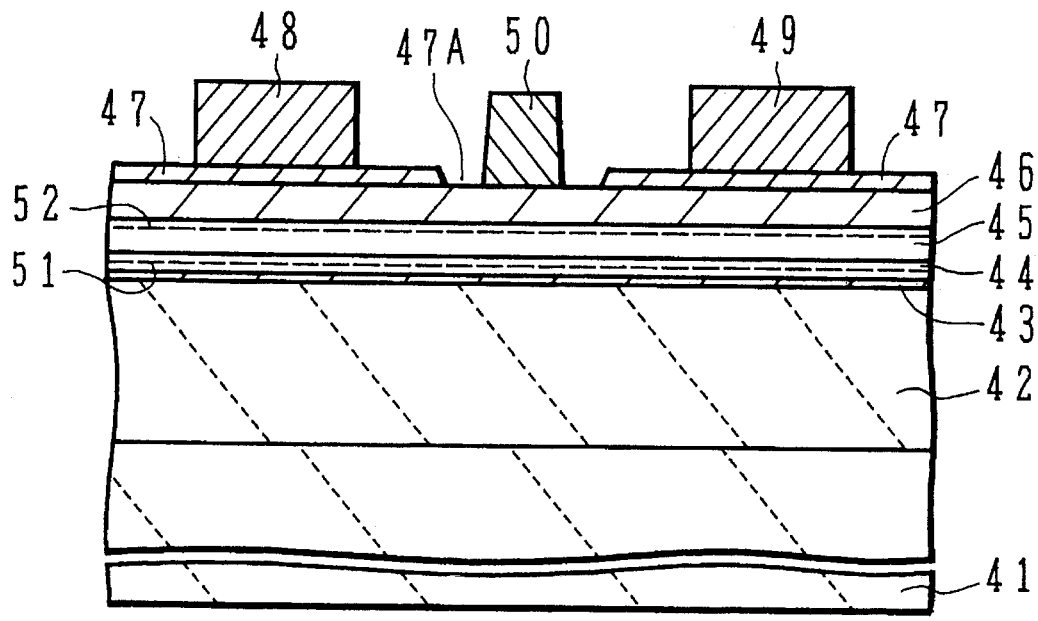
FIGS. 3A and 3B are side views of cross sections of a main portion of an HEMT according to a second embodiment of the present invention.

FIG. 3A is a side view of a cross section of a main portion of an HEMT according to a second embodiment of the present invention.

The device includes a multi-layered stack including carrier supply layers (for example, an n-type AlGaAs lower electron supply layer 43 and an n-type AlGaAs upper electron supply layer 46) and carrier transport layers (for example, a non-doped InGaAs lower channel layer 44 and a non-doped GaAs upper channel layer 45) to form a plurality of hetero-junctions so as to prepare 2DEG layers (for example, a lower 2DEG layer 51 and an upper 2DEG layer 52) in hetero-boundary regions on the channel layer side, a source electrode (for example, a source electrode 48) and a drain electrode (for example, a drain electrode region 49) being disposed with an interval on a surface of the layer stack to oppose each other and to be conductive to the 2DEG layers, and a gate electrode (for example, a gate electrode 50) extending between the source and drain electrodes to have a Schottky contact with the upper-most carrier supply layer. Of each pair of the channel layer and the carrier supply layer, those (such as the layer 44) apart from the gate electrode are fabricated with a material (namely, InGaAs) such that the effective mass of carriers therein is smaller than that of the channel layers (such as the layer 45) near the gate electrode.

Referring now to FIG. 3A, description will be given of manufacturing process of the device.
3-(1)

On a semi-insulating GaAs substrate 41, there are sequentially piled a non-doped GaAs buffer layer 42, an n-type AlGaAs lower electron supply layer 43, a non-doped GaAs lower electron transport layer 44, a non-doped GaAs upper electron transport layer 45, an n-type AlGaAs upper electron supply layer 46, and an N-type GaAs cap layer 47 by MBE.

These layers are fabricated in accordance with the following parameter values, for example.

| | |
|---|---|
| ① | Non-doped GaAs buffer layer 42<br>Thickness: 1 μm |
| ② | n-type AlGaAs lower electron supply layer 43<br>Electron density: $2.0 \times 10^{18}$ cm$^{-3}$<br>Dopant: Si<br>Thickness: 50 A |
| ③ | Non-doped InGaAs lower electron transport layer 44<br>In composition: 0.20<br>Thickness: 150 A |
| ④ | Non-doped GaAs upper electron transport layer 45<br>Thickness: 400 A |
| ⑤ | n-type AlGaAs upper electron supply layer 46<br>Electron density: $2.0 \times 10^{18}$ cm$^{-3}$<br>Dopant: Si<br>Thickness: 400 A |
| ⑥ | n-type GaAs cap layer 47<br>Electron density: $2.0 \times 10^{18}$ cm$^{-3}$<br>Dopant: Si<br>Thickness: 200 A |

In order to manufacture the layers above, there may be appropriately employed, for example, MOCVD in place of MBE. In this connection, the composition of aluminum in AlGaAs is 0.25 in all cases.
3-(2)

According to a resist process of lithography and a vacuum vapor deposition, there is formed a resist layer having openings for areas in which source and drain electrodes are to be manufactured, and then an AuGe/Au layer stack is grown, the AuGe and Au layers having thicknesses of, for example, 400 A and 4000 A, respectively.
3-(3)

Dipping in a resist remover, the resist layer formed in the process step 3-(2) is peeled off, and then the AuGe/Au film block is patterned through lift-off process, thereby fabricating the source and drain electrodes 48 and 49.
3-(4)

Through a resist process and an RIE using a CCl$_2$F$_2$ gas as the etching gas, the n-type GaAs cap layer 47 is etched, thereby forming a gate recess 47A.
3-(5)

With the resist layer formed in the step 3-(4) kept remained, vacuum deposition is carried out to fabricate a Ti/Au stack, the Ti and Au layers having thicknesses of, for example, 200 A and 3000 A, respectively.
3-(6)

Dipping in a resist remover, the resist layer manufactured in the process step 3-(4) is removed, and then the Ti/Au stack is patterned through a lift-off process, thereby forming the gate electrode 50 having a Schottky contact with the n-type AlGaAs upper electron supply layer 46 exposed in the gate recess 47A. In this regard, reference numerals 50 and 51 designate lower and upper 2DEG layers, respectively.

Figure 4:
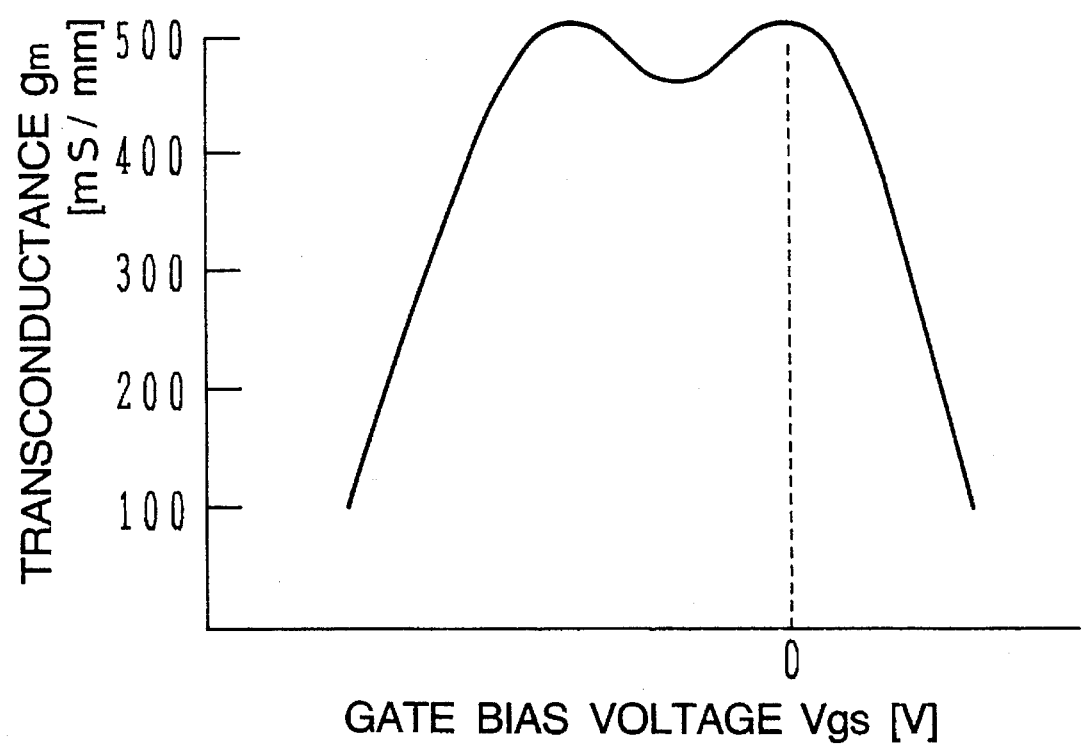
FIG. 4 is a graph showing a relationship between the transconductance $g_m$ and the gate bias voltage $V_{gs}$ of the second embodiment of FIGS. 3A and 3B.

FIG. 4 is a graph showing a relationship between transconductance $g_m$ and the gate bias voltage $V_{gs}$ of the example of HEMT according to the second embodiment of FIG. 3A. The abscissa and the ordinate denote the gate bias voltage $V_{gs}$ and the transconductance $g_m$, respectively. The transconductance $g_m$ is represented with values per unitary gate width (mm).

As can be seen from the graph, also in the second embodiment, although the characteristic curve of a relationship between the transconductance $g_m$ and the voltage $V_{gs}$ includes two peaks respectively related to the lower and upper 2DEG layers 51 and 52, the peaks take substantially an identical value and hence the general contour is substantially flat.

In the second embodiment, since the lower channel layer 44 is fabricated with InGaAs in which the effective mass of electrons is small, the electron speed and mobility in the layer 44 are higher than those developed in the upper channel layer 45.

Figure 3B:
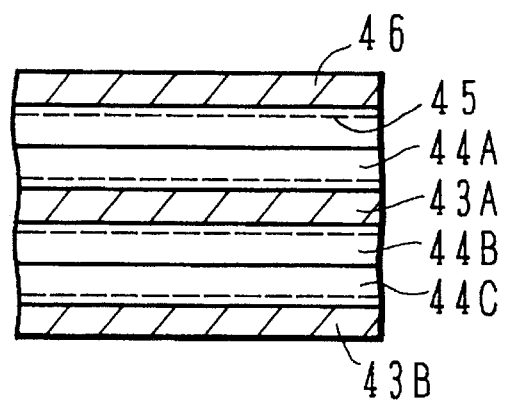

FIG. 3B shows a cross-sectional view of another example of the configuration of a semiconductor device according to a second embodiment. On a bottom surface of an upper channel layer 45 on which an upper carrier supply layer 46 is formed, there are sequentially manufactured a first lower channel layer 44A, a first lower carrier supply layer 43A, a second lower channel layer 44B, a third lower carrier supply layer 44C, and a second lower carrier supply layer 43B.

In a case including at least three lower channel layers as above, each lower channel layer remote from the associated gate electrode is formed of InGaAs. Moreover, the composition of In is increased as the channel layer is much more apart from the gate electrode.

Figure 5:
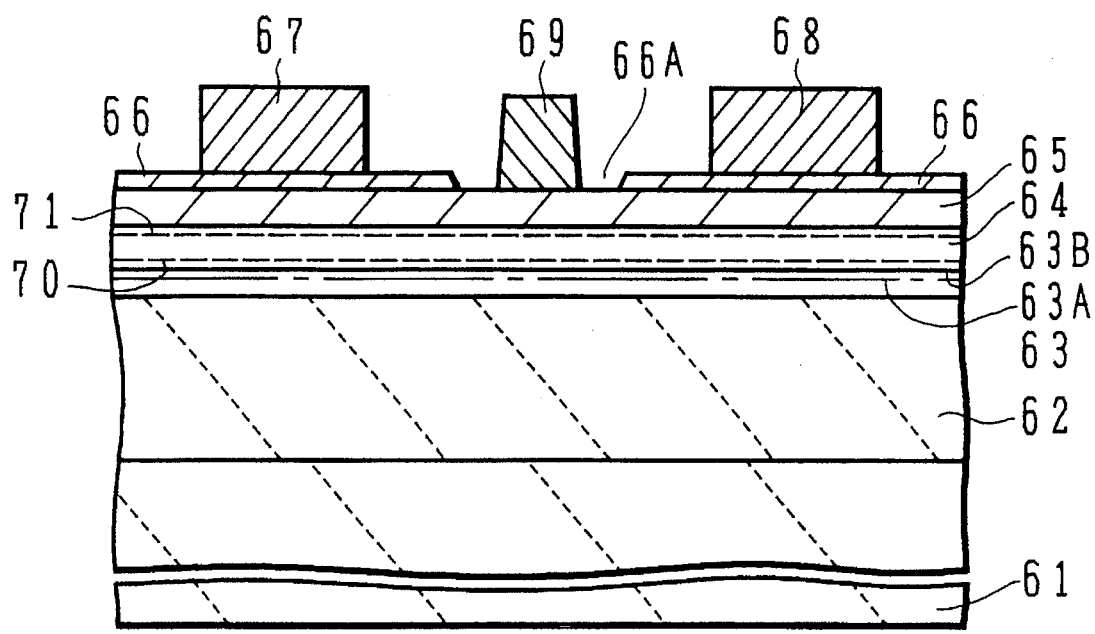
FIG. 5 is a side view of a cross section of a main portion of an HEMT according to a third embodiment of the present invention.

FIG. 5 is a side view of a cross section of a primary portion of an HEMT according to a third embodiment of the present invention.

The HEMT device includes a layer stack including carrier supply layers (for example, a non-doped AlGaAs lower electron supply layer 63, an n-type AlGaAs upper electron supply layer 65) and channel layers (for example, a non-doped GaAs channel layer 64) to form a plurality of heterojunctions so as to provide 2DEG layers (for example, a lower 2DEG layer 70 and an upper layer 71) in heteroboundary regions on the carrier transport layer side, a source electrode (for example, a source electrode region 67) and a drain electrode (for example, a drain electrode 68) being disposed with an interval on a surface of the layer stack to oppose each other and to be conductive to the two-dimensional carrier gas layers, and a gate electrode (for example, a gate electrode 69) extending between the source and drain electrodes to have a Schottky contact with the upper-most carrier supply layer. Of each pair of the carrier transport layers, those (such as the layer 65) less apart from the gate electrode are uniformly doped, whereas those (such as the layer 63) apart therefrom is planar-doped (for example, in a doping plane 63A).

In this connection, when there are disposed at least three 2DEG heterojunctions, it is favorable to set the planar doping density to a higher value as the distance between the layer and the gate electrode is increased.

Referring now to FIG. 5, description will be given of manufacturing process of the device.

5-(1)

On a semi-insulating GaAs substrate 61, there are sequentially piled a non-doped GaAs buffer layer 62 and a non-doped AlGaAs lower electron transport layer 63.

These layers are manufactured with the following parameters.

| | |
|---|---|
| ① | Non-doped GaAs buffer layer 62<br>Thickness: 1 μm |
| ② | Non-doped AlGaAs lower electron transport layer 63<br>Thickness: 200 A |

5-(2)

A planar doping is conducted thereon to form a doped surface region 63A. The dopant is Si and the impurity surface B density is $7.0 \times 10^{12}$ cm$^{-2}$.

Resultantly, the layer 63 can serve as substantially an electron supply layer.

5-(3)

Subsequently, there are sequentially fabricated thereon a non-doped AlGaAs spacer layer 63B, a non-doped GaAs electron transport layer 64, an n-type AlGaAs upper electron supply layer 65, and an N-type GaAs cap layer 66 so as to produce a multi-layered stack by MBE.

These layers are fabricated according to the following parameter values.

| | |
|---|---|
| ① | Non-doped AlGaAs spacer layer 63B<br>Thickness: 30 A |
| ② | Non-doped GaAs electron transport layer 64<br>Thickness: 500 A |
| ③ | n-type AlGaAs upper electron supply layer 65<br>Electron density: $2.0 \times 10^{18}$ cm$^{-3}$<br>Dopant: Si<br>Thickness: 400 A |
| ④ | Non-doped GaAs cap layer 66<br>Electron density: $2.0 \times 10^{18}$ cm$^{-3}$<br>Dopant: Si<br>Thickness: 200 A |

In this regard, the composition of Al is 0.25 in all cases of AlGaAs in this embodiment.

5-(4)

Utilizing resist process of lithography and a vacuum deposition, there is formed a resist layer having openings for areas where source and drain electrodes are to be fabricated, and then a stack of AuGe and Au layers are piled, the layers being, for example, 400 A and 4000 A thick, respectively.

5-(5)

Dipping in a resist remover, the resist layer formed in the process step 5-(4) is peeled off, and then the AuGe/Au stack is subjected to a patterning operation through lift-off process, thereby forming the source and drain electrodes 67 and 68.

5-(6)

Through resist process and RIE employing a $CCl_2F_2$ gas as the etching gas, the n-type GaAs cap layer 66 is etched to form a gate recess 66A.

5-(7)

Without exerting influence upon the resist layer formed in the step 3-(4), vacuum deposition is carried out to fabricate a Ti/Au stack, the Ti and Au layers being, for example, 200 A and 3000 A thick, respectively.

5-(8)

Dipping in a resist remover, the resist layer manufactured in the process step 5-(6) is peeled off, and then the Ti/Au layer stack is patterned through lift-off process so as to form the gate electrode 69 having a Schottky contact with the n-type AlGaAs upper electron supply layer 65 exposed in the gate recess 66A. In this connection, reference numerals 70 and 71 denote lower and upper 3DEG layers, respectively.

Figure 6:
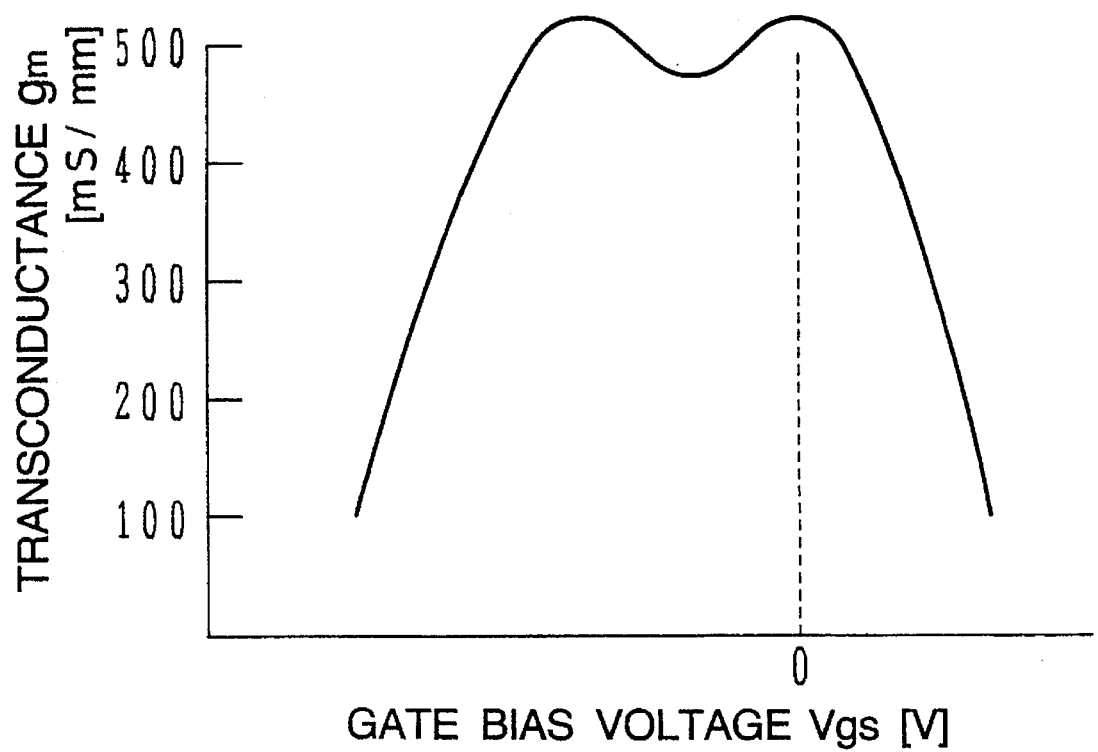
FIG. 6 is a graph showing a relationship between the transconductance $g_m$ and the gate bias voltage $V_{gs}$ of the third embodiment of FIG. 5.

FIG. 6 is a graph showing a relationship between the transconductance $g_m$ and the gate bias voltage $V_{gs}$ of the example of HEMT according to the third embodiment of FIG. 5. The abscissa and the ordinate denote the gate bias voltage $V_{gs}$ and the transconductance $g_m$, respectively. The transconductance $g_m$ is represented with values per unitary gate width (mm).

As can be seen from the graph, also in the third embodiment, although the characteristic curve of the relationship between the transconductance $g_m$ and the voltage $V_{gs}$ includes two peaks respectively related to the lower and upper 2DEG layers 70 and 71, the peak values are substantially identical to each other and hence the general contour of the curve is substantially flat.

In the third embodiment, the doped surface region 63 is prepared in the surface of the non-doped AlGaAs lower electron supply layer 63 according to the planar doping technique. Namely, electrons are supplied substantially from this region. In general, in the planar doping process, donor impurities are supplied into a surface in areal units. Consequently, the thickness of the electron supply layer can be minimized. In a case of the multi-hetero-structure, this facilitates the control of the electron density in the lower 2DEG layer 70. Moreover, the planar doping results in an increase in the activation ratio and hence is applicable to the lower side also in the double-hetero-structure.

Figure 7:
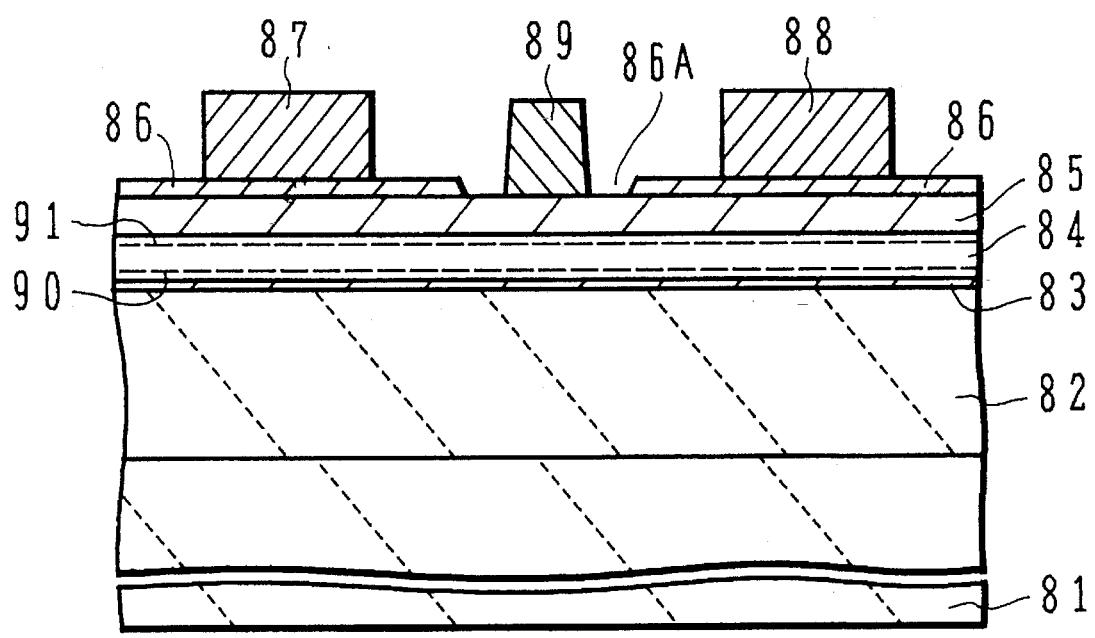
FIG. 7 is a side view of a cross section of a main portion of an HEMT according to a fourth embodiment of the present invention.

FIG. 7 shows a cross section in a side view of a primary portion of an HEMT according to a fourth embodiment of the present invention.

The device includes a multi-layered stack including carrier supply layers (for example, an n-type InGaP lower electron supply layer 83 and an n-type AlGaAs upper electron supply layer 85) and channel layers (for example, a non-doped GaAs channel layer 84) to form a plurality of hetero-junctions so as to provide 2DEG layers (for example, a lower 2DEG layer 90 and an upper 2DEG layer 91) in hetero-intersections on the channel layer side, a source electrode (for example, a source electrode region 87) and a drain electrode (for example, a drain electrode 88) being disposed with an interval on a surface of the layer stack to oppose each other and to be conductive to the 2DEG layers, and a gate electrode (for example, a gate electrode 89) extending between the source and drain electrodes to develop a Schottky contact with the uppermost carrier supply layer. As for the energy band, in the pair of the electron supply layers, the layer (such as the electron supply layer 85) less apart from the gate electrode has a wider band gap as compared with the layer (such as the electron supply layer 83) apart from the gate electrode.

Next, a manufacturing process of the device will be described by reference to FIG. 7.

7-(1)

On a semi-insulating GaAs substrate 81, there are sequentially piled a non-doped GaAs buffer layer 82, an n-type InGaP lower electron supply layer 83, a non-doped GaAs electron transport layer 84, an n-type AlGaAs upper electron transport layer 85, and an n-type GaAs cap layer 86 by MBE.

These layers are fabricated in accordance with the following parameters, for example.

| | |
|---|---|
| ① | Non-doped GaAs buffer layer 82<br>Thickness: 1 μm |
| ② | n-type InGaP lower electron supply layer 83<br>Composition of In: 0.49 |

-continued

| | |
|---|---|
| | Electron density: $2.0 \times 10^{18}$ cm$^{-3}$<br>Dopant: Si<br>Thickness: 50 A |
| ③ | Non-doped GaAs channel layer 84<br>Thickness: 500 A |
| ④ | n-type AlGaAs upper electron supply layer 85<br>Electron density: $2.0 \times 10^{18}$ cm$^{-3}$<br>Dopant: Si<br>Thickness: 400 A |
| ⑤ | n-type GaAs cap layer 86<br>Electron density: $2.0 \times 10^{18}$ cm$^{-3}$<br>Dopant: Si<br>Thickness: 200 A |

In fabrication of the layers above, there may be appropriately employed, for example, MOCVD in place of MBE. In this connection, composition of aluminum in AlGaAs is 0.25 in all cases.

7-(2)

Using a resist process of lithography and a vacuum vapor deposition, there is formed a resist layer having openings for areas in which source and drain electrodes are to be manufactured, and then a layer stack of AuGe/Au is grown, the AuGe and Au layers being, for example, 400 A and 4000 A thick, respectively.

7-(3)

Dipping in a resist remover, the resist layer formed in the process step 7-(2) is peeled off, and then the AuGe/Au layer stack is patterned through lift-off process, thereby fabricating the source and drain electrodes 87 and 88.

7-(4)

Through resist process and RIE using a $CCl_2F_2$ gas as the etching gas, the n-type GaAs cap layer 86 is etched to thereby form a gate recess 86A.

7-(5)

With the resist layer formed in the step 7-(4) kept remained, vapor deposition is effected to form a Ti/Au stack, the Ti and Au layers being, for example, 200 A and 3000 A thick, respectively.

7-(6)

Dipping in a resist remover, the resist layer manufactured in the process step 7-(4) is removed, and then the Ti/Au structure is patterned through lift-off process, thereby fabricating the gate electrode 89 having a Schottky contact with the n-type AlGaAs upper electron supply layer 85 exposed in the gate recess 86A. In this regard, reference numerals 90 and 91 denote lower and upper 2DEG layers, respectively.

Figure 8:
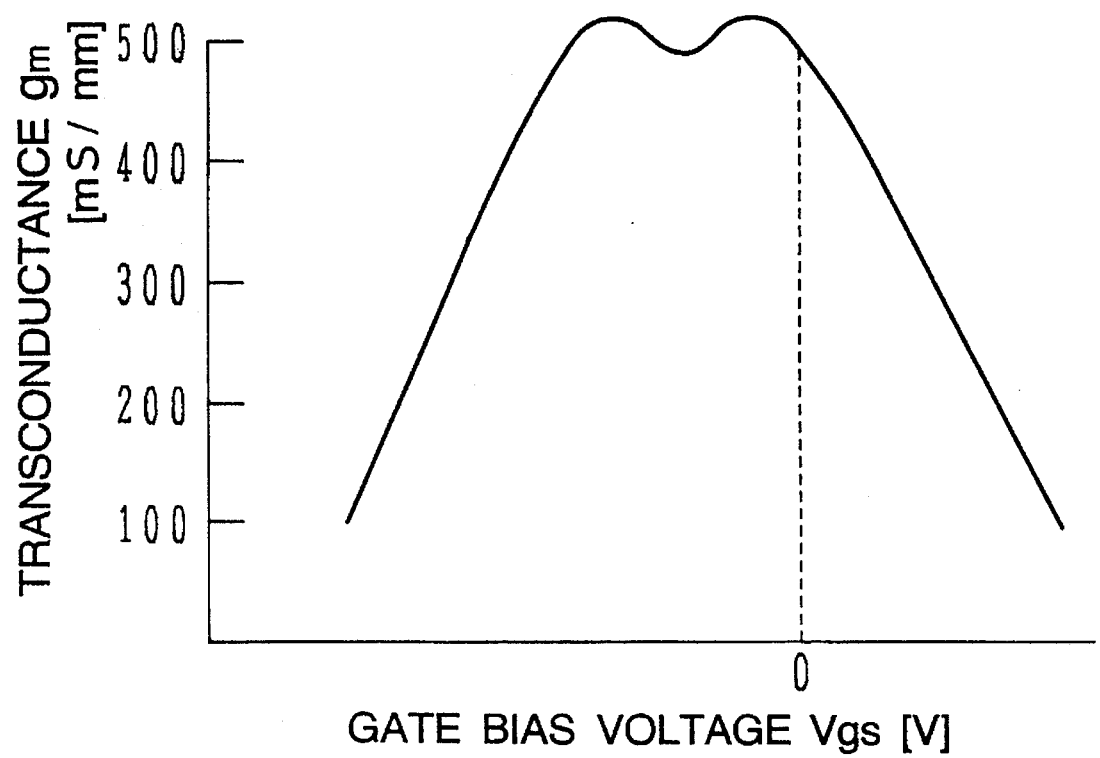
FIG. 8 is a graph showing a relationship between the the transconductance $g_m$ and the gate bias voltage $V_{gs}$ of the fourth embodiment of FIG. 5.

FIG. 8 is a graph showing a relationship between the transconductance $g_m$ and the gate bias voltage $V_{gs}$ of the example of HEMT according to the fourth embodiment of FIG. 7. The abscissa and the ordinate stand for the gate bias voltage $V_{gs}$ and the transconductance $g_m$, respectively. The transconductance $g_m$ is represented with values per unitary gate width (mm).

As shown in the graph, also in the fourth embodiment, although the characteristic curve of a relationship between the transconductance $g_m$ and the voltage $V_{gs}$ includes two peaks respectively associated with the lower and upper 2DEG layers 90 and 91, the peaks take substantially similar value and hence the general contour of the characteristic curve is substantially flat.

In the fourth embodiment, since the energy band of the lower electron supply layer 83 is wider than that of the upper electron supply layer 85, the 2DEG density can be increased in the lower 2DEG layer 90.

As above, in the first, third, and fourth embodiments, the object is achieved by altering the configuration of the electron supply layers; whereas, in the second embodiment, the constitution of the channel layers is changed for the purpose. Consequently, there may naturally be implemented an embodiment in which the construction of the electron supply layer as well as that of the channel layer are varied.

Figure 9:
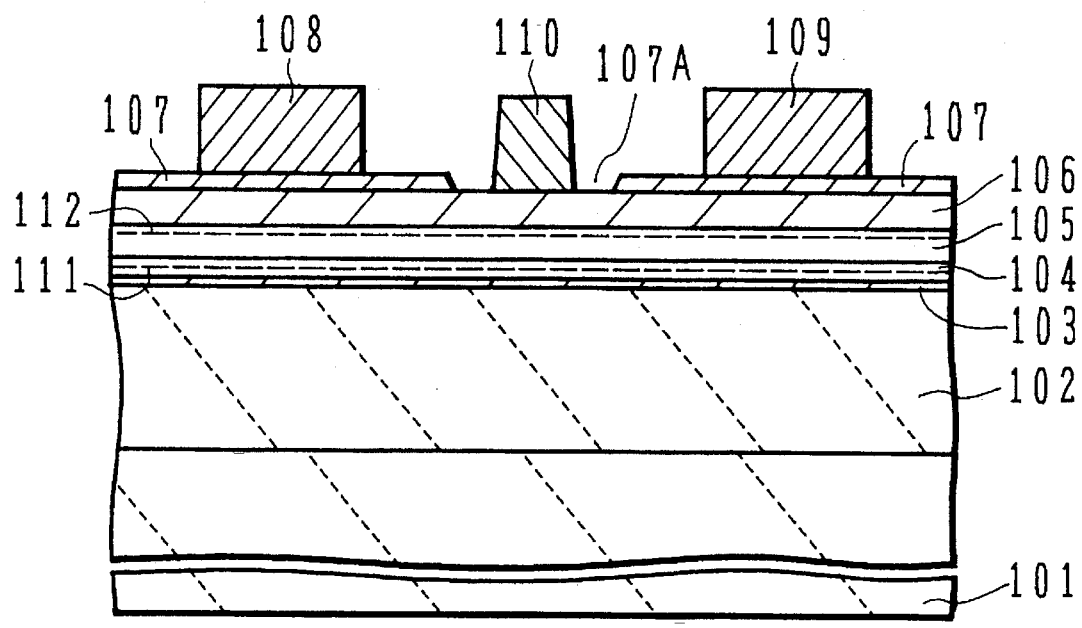
FIG. 9 is a side view of a cross section of a main portion of an HEMT according to a fifth embodiment of the present invention.

FIG. 9 shows a cross-sectional view of the HEMT according to a fifth embodiment of the present invention. Referring to this diagram, description will be given of a manufacturing process of the device.

9-(1)

On a semi-insulating GaAs substrate 101, there are sequentially fabricated a non-doped GaAs buffer layer 102, an n-type AlGaAs lower electron supply layer 103, a non-doped InGaAs lower channel layer 104, a non-doped GaAs upper channel layer 105, an n-type AlGaAs upper electron supply layer 106, and an n-type GaAs cap layer 107 so as to produce a stack structure by MBE.

These layers are manufactured with the following parameter values.

| | | |
|---|---|---|
| ① | Non-doped GaAs buffer layer 102 | |
| | Thickness: 1 µm | |
| ② | n-type AlGaAs lower electron supply layer 103 | |
| | Electron density: $3.0 \times 10^{18}$ cm$^{-3}$ | |
| | Dopant: Si | |
| | Thickness: 50 A | |
| ③ | Non-doped InGaAs lower channel layer 104 | |
| | Composition ratio of In: 0.20 | |
| | Thickness: 150 A | |
| ④ | Non-doped GaAs upper channel layer 105 | |
| | Thickness: 500 A | |
| ⑤ | n-type AlGaAs upper electron supply layer 106 | |
| | Electron density: $2.0 \times 10^{18}$ cm$^{-3}$ | |
| | Dopant: Si | |
| | Thickness: 400 A | |
| ⑥ | n-type GaAs cap layer 107 | |
| | Electron density: $2.0 \times 10^{18}$ cm$^{-3}$ | |
| | Dopant: Si | |
| | Thickness: 200 A | |

In order to manufacture the layers above, there may be appropriately employed, for example, MOCVD in place of MBE. In this connection, the composition of aluminum in AlGaAs is 0.25 in each case.

9-(2)

Utilizing resist process of lithography and vacuum deposition, there is formed a resist layer having openings for areas where source and drain electrodes are to be fabricated, and then a stack of AuGe and Au layers is formed, the layers being, for example, 400 A and 4000 A thick, respectively.

9-(3)

Dipping a resist remover, the resist layer formed in the process step 7-(2) is peeled off, and then the AuGe/Au layer stack is patterned through life-off process, thereby forming the source and drain electrodes 108 and 109.

9-(4)

Through resist process of lithography and RIE using a CCl$_2$F$_2$ gas as the etching gas, the n-type GaAs cap layer 47 is etched so as to form a gate recess 107A.

9-(5)

With the resist layer formed in the step 3-(4) kept remained, vacuum deposition is conducted to fabricate a Ti/Au stack, the Ti and Au layers having thicknesses of, for example, 200 A and 3000 A, respectively.

9-(6)

Dipping in a resist remover, the resist layer manufactured in the process step 9-(4) is removed, and then the Ti/Au layer stack is patterned through lift-off process, thereby forming the gate electrode region 50 having a Schottky contact with the n-type AlGaAs upper electron supply layer 106 exposed in the gate recess 107 A. In this regard, reference numerals 110 and 111 indicate lower and upper 2DEG layers, respectively.

Figure 10:
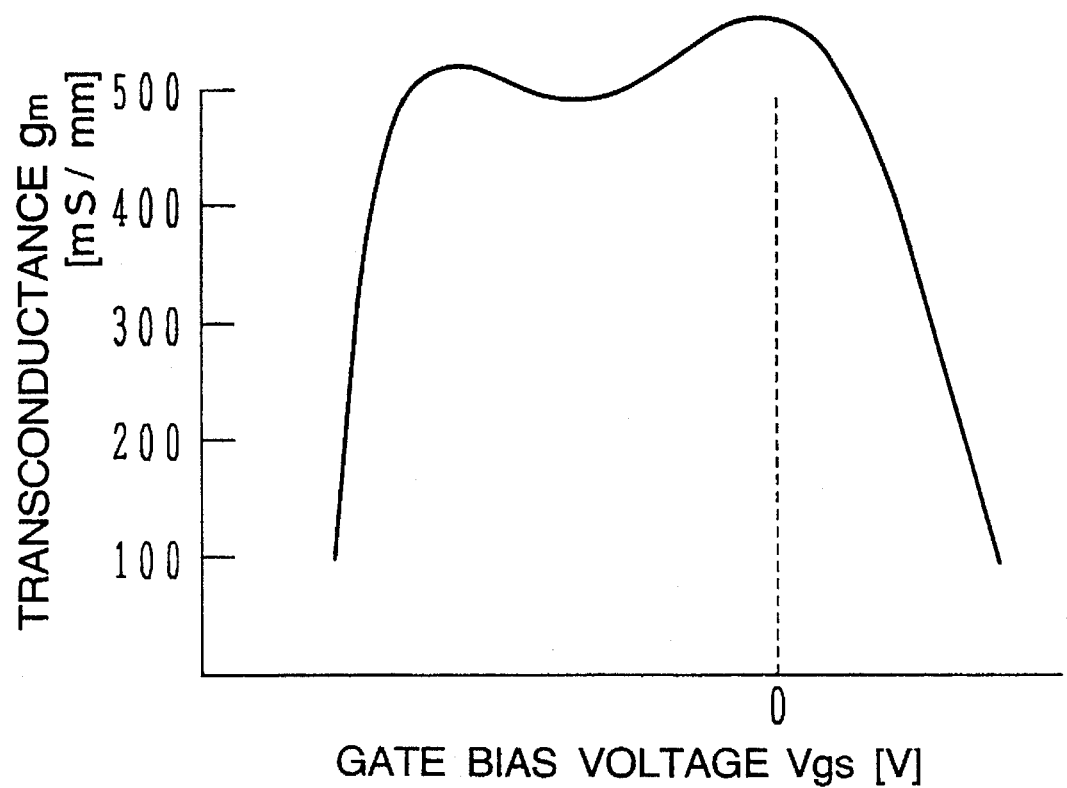
FIG. 10 is a graph showing a relationship between the transconductance $g_m$ and the gate bias voltage $V_{gs}$ of the fifth embodiment of FIG. 5.
Figure 11:
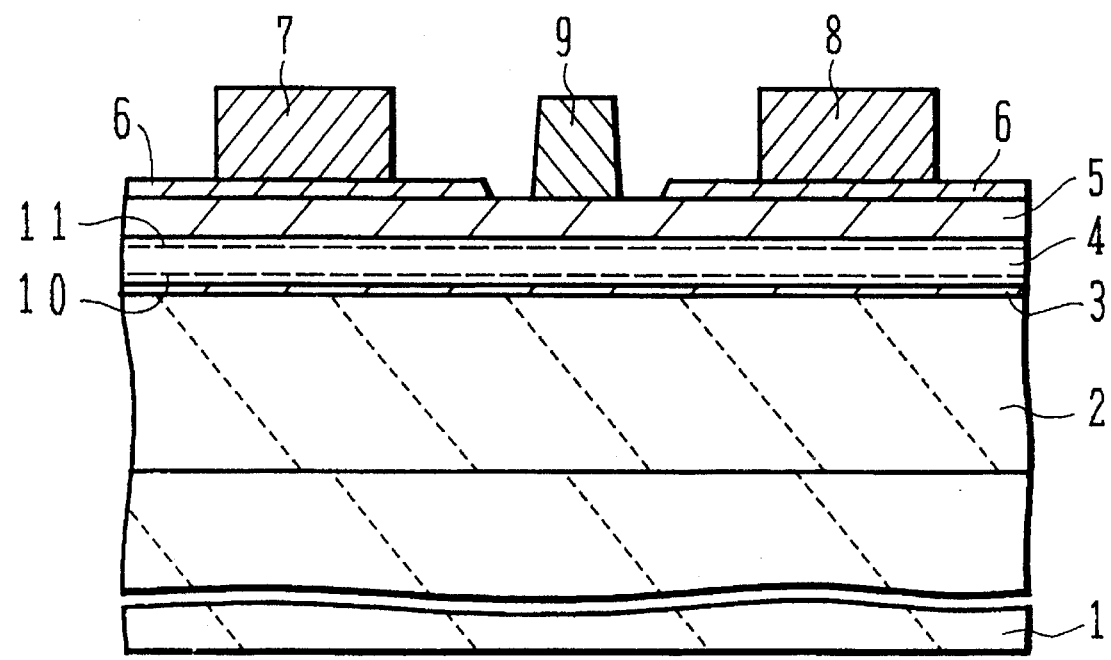
FIG. 11 is a side view of a cross section of a main portion of an HEMT having a double hetero-structure according to the prior art.
Figure 12:
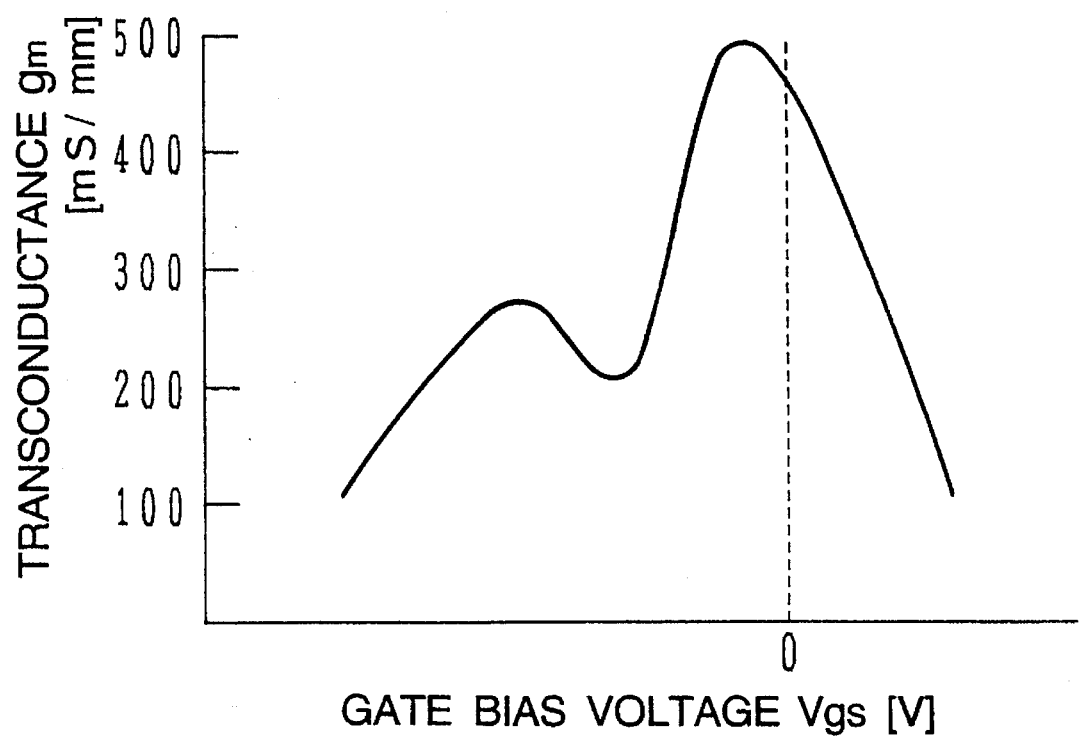
FIG. 12 is a graph showing a relationship between the transconductance $g_m$ and the gate bias voltage $V_{gs}$ of the conventional example of FIG. 11.

FIG. 10 is a graph showing a relationship between the transconductance $g_m$ and the gate bias voltage $V_{gs}$ of the example of HEMT according to the fifth embodiment of FIG. 9. The abscissa and the ordinate denote the gate bias voltage $V_{gs}$ and the transconductance $g_m$, respectively. The transconductance $g_m$ is represented with values per unitary gate width (mm).

As can be seen from the graph, also in the fifth embodiment, the characteristic curve of a relationship between the transconductance $g_m$ and the voltage $V_{gs}$ includes two peaks respectively associated with the lower and upper 2DEG layers 111 and 112. The peaks are less satisfactorily balanced as compared with those of the preceding embodiments. However, the general contour is substantially flat enough for practical applications.

In the fifth embodiment, between the lower and upper electron supply layers 103 and 106, there is missing the proportional relationship with respect to the electron density, which exists in the first embodiment.

While particular embodiments of the invention have been shown and described, it will be obvious to those skilled in the art that various changes and modifications may be made without departing from the aspect and spirit of the present invention.

We claim:

1. A high electron mobility field effect semiconductor device comprising:

a layer stack including carrier supply layers and carrier transport layers forming a plurality of hetero-junctions so as to provide two-dimensional carrier gas layers in hetero-interfaces on the carrier transport layer side;

a source electrode and a drain electrode, the electrodes being disposed with an interval on a surface of the layer stack to oppose each other and to be conductive to form electrical connection with the two-dimensional carrier gas layers; and a gate electrode extending between the source and drain electrodes to form a Schottky contact with an uppermost one of said carrier supply layers, wherein one of said carrier supply layers remote from the gate electrode has a carrier density higher than that of another of said carrier supply layers less remote from the gate electrode.

2. A high electron mobility field effect semiconductor device according to claim 1, wherein:

one of said carrier supply layers less remote from the gate electrode is uniformly doped; and another of said carrier supply layers remote from the gate electrode is planar-doped.

3. A high electron mobility field effect semiconductor device comprising:

a layer stack including carrier supply layers and carrier transport layers forming a plurality of hetero-junctions so as to provide two-dimensional carrier gas layers in hetero-interfaces on the carrier transport layer side;

a source electrode and a drain electrode, the electrodes being disposed with an interval on a surface of the layer stack to oppose each other and to be conductive to form electrical connection with the two-dimensional carrier gas layers; and a gate electrode extending between the source and drain electrodes to form a Schottky contact with an uppermost one of said carrier supply layers, wherein
one of said carrier transport layers remote from the gate electrode is formed of such material that an effective mass of carriers therein is smaller than that of carrier in another of said carrier transport layers less remote from the gate electrode,
said carrier transport layers comprise three or more layers including InGaAs layers on a remote side from the gate electrode, one of said InGaAs layers remote from the gate electrode has a higher In composition than that of another of said InGaAs layers less remote from the gate electrode.

4. A high electron mobility field effect semiconductor device having a hetero-structure, the semiconductor device comprising:

a layer stack including carrier supply layers and carrier transport layers forming a plurality of hetero-junctions so as to provide two-dimensional carrier gas layers in hetero-interfaces on the carrier transport layer side;

a source electrode and a drain electrode, the electrodes being disposed with an interval on a surface of the layer stack to oppose each other to be conductive to form electrical connection with the two-dimensional carrier gas layers; and a gate electrode extending between the source and drain electrodes to form a Schottky contact with an uppermost one of said carrier supply layers, wherein one of said carrier transport layers remote from the gate electrode is formed of such material that an effective mass of carriers therein is smaller than that of carriers in another of said carrier transport layers less remote from the gate electrode, said carrier transport layers comprise three or more layers including InGaAs layers on a remote side from the gate electrode, one of said InGaAs layers remote from the gate electrode has a higher In composition than that of another of said InGaAs layers less remote from the gate electrode, wherein:

the hetero-structure includes at least three hetero-junctions; and each of said carrier transport layers remote from the gate electrode comprises InGaAs, composition of In in said InGaAs carrier transport layers is set to a larger value as a distance between the gate electrode and the carrier transport layer is increased.

5. A high electron mobility field effect semiconductor device comprising:

a layer stack including carrier supply layers and carrier transport layers, forming a plurality of hetero-junctions so as to provide a two-dimensional carrier gas layers in hetero-interfaces on the carrier transport layer side;

a source electrode and a drain electrode, the electrodes being disposed with an interval on a surface of the layer stack to oppose each other and to be conductive to form electrical connection with the two-dimensional carrier gas layers; and a gate electrode extending between the source and drain electrodes to form a Schottky contact with an uppermost one of said carrier supply layers, wherein:

one of said carrier supply layers less remote from the gate electrode is uniformly doped; and another of said carrier supply layers remote from the gate electrode is planar-doped, wherein:

there are formed at least three hetero-junctions; and a carrier density of the planar doped carrier supply layer is set so that the carrier density of the planar doped carrier supply layer becomes higher as the distance between the gate electrode and the planar doped carrier supply layer is increased.

* * * * *

UNITED STATES PATENT AND TRADEMARK OFFICE
CERTIFICATE OF CORRECTION

PATENT NO. : 5,473,175
DATED : December 5, 1995
INVENTOR(S) : Jun-Ichiro NIKAIDO, et al.

It is certified that error appears in the above-indentified patent and that said Letters Patent is hereby corrected as shown below:

Title Page [73] Assignees: change "Fijitsu" to --Fujitsu-- (first and second occurrences).

Signed and Sealed this

Second Day of April, 1996

BRUCE LEHMAN

Attest:

*Attesting Officer*  *Commissioner of Patents and Trademarks*

UNITED STATES PATENT AND TRADEMARK OFFICE
CERTIFICATE OF CORRECTION

PATENT NO. : 5,473,175
DATED : December 5, 1995
INVENTOR(S) : Jun-Ichiro NIKAIDO, et al.

It is certified that error appears in the above-indentified patent and that said Letters Patent is hereby corrected as shown below:

Title Page, [75], change second inventor's family name "Minimo" to --Mimino--.

Signed and Sealed this

Eleventh Day of March, 1997

*Attest:*

BRUCE LEHMAN

*Attesting Officer*  *Commissioner of Patents and Trademarks*